(12) United States Patent
Miyamoto et al.

(10) Patent No.: US 7,777,533 B2
(45) Date of Patent: Aug. 17, 2010

(54) SEMICONDUCTOR DEVICE

(75) Inventors: Noboru Miyamoto, Tokyo (JP); Natsuki Tsuji, Hiroshima (JP)

(73) Assignee: Mitsubishi Electric Corporation, Tokyo (JP)

( * ) Notice: Subject to any disclaimer, the term of this patent is extended or adjusted under 35 U.S.C. 154(b) by 15 days.

(21) Appl. No.: 12/116,570

(22) Filed: May 7, 2008

(65) Prior Publication Data
US 2009/0096502 A1   Apr. 16, 2009

(30) Foreign Application Priority Data
Oct. 12, 2007  (JP) .............................. 2007-267089

(51) Int. Cl.
H03B 1/00 (2006.01)
H03K 3/00 (2006.01)

(52) U.S. Cl. ...................................... 327/112; 327/108
(58) Field of Classification Search .......... 327/108–112
See application file for complete search history.

(56) References Cited
FOREIGN PATENT DOCUMENTS

| JP | 9-172786 | 6/1997 | | |
|---|---|---|---|---|
| JP | 10-337046 | * 12/1998 | ...................... | 7/48 |
| JP | 2001-69795 | 3/2001 | | |
| JP | 2002-204581 | 7/2002 | | |
| JP | 2003-324928 | 11/2003 | | |

* cited by examiner

Primary Examiner—Lincoln Donovan
Assistant Examiner—Daniel Rojas
(74) Attorney, Agent, or Firm—Oblon, Spivak, McClelland, Maier & Neustadt, L.L.P.

(57) ABSTRACT

The present invention provides a semiconductor device includes arms formed by two semiconductor elements, a map memory device which stores therein a correlation map between a control value for each of the arms and an optimized dead time to be set for the control value or is capable of storing the same therein, drive control value acquiring means for acquiring a drive control value of each of the arms, and a dead time generating circuit for extracting the optimized dead time corresponding to the drive control value from the correlation map. The time taken until the other of the semiconductor elements is turned on after one thereof has received a command to turn off the same is the optimized dead time extracted by the dead time generating circuit.

18 Claims, 6 Drawing Sheets

SEMICONDUCTOR DEVICE

BACKGROUND OF THE INVENTION

1. Field of the Invention

The present invention relates to a semiconductor device which sets dead time to control each semiconductor element, and particularly to a semiconductor device capable of easily determining dead time optimum for a semiconductor element and maintaining a stable control state.

2. Background Art

There are known semiconductor switches formed by configurations called arms, in which two semiconductor elements are arranged vertically. In the configurations, the semiconductor element on the upper side is called upper arm, and the semiconductor element on the lower side is called lower arm. When the upper arm and the lower arm are both on, a short circuit (arm short-circuit) occurs between the upper arm and the lower arm, so that a short-circuit current flows, thus producing bad influences such as characteristic degradation of the upper and lower arms.

Such an arm short-circuit is caused by turning on of the lower arm before the upper arm is completely turned off, for example. In order to prevent the arm short-circuit, a command to turn off one of the arms is transmitted and thereafter a command to turn on the other arm is transmitted after a time interval called dead time has elapsed. Here, the dead time indicates the time set to compensate for prevention of simultaneous turning-on of the upper and lower arms. It is general that the dead time is set to the maximum value of the time necessary for an off operation of each semiconductor element.

A power conversion device disclosed in a patent document 1 is equipped with a dead time control circuit to detect outputs of respective arms and determine dead time from the values thereof. The dead time generated by the dead time control circuit is determined or fixed in such a manner that a short circuit can be suppressed and a high-frequency operation can be performed under satisfactory control.

Earlier Literature related to above descriptions are [Patent Document 1] JP-A-10-337046, [Patent Document 2] JP-A-2002-204581, [Patent Document 3] JP-A-9-172786, [Patent Document 4] JP-A-2003-324928 and, [Patent Document 5] JP-A-2001-69795.

When a command is given to each semiconductor device, the power conversion device disclosed in the patent document 1 computes or calculates optimum dead time as its occasion arises. That is, in order to generate a command, there is a need to compute dead time after the measurement of current flowing through the semiconductor element. Thus, the power conversion device disclosed in the patent document 1 was accompanied by the problem that processing was complex. A problem also arises in that a deviation occurs between a commanded control value and an actual control value due to the provision of the dead time, thus impairing the stability of control.

SUMMARY OF THE INVENTION

The present invention has been made to solve the above problems. It is therefore an object of the present invention to provide a semiconductor device capable of generating optimum dead time by simple processing while the stability of control thereof is being maintained.

According to one aspect of the present invention, a semiconductor device includes arms formed by two semiconductor elements, a map memory device which stores therein a correlation map between a control value for each of the arms and an optimized dead time to be set for the control value or is capable of storing the same therein, drive control value acquiring means for acquiring a drive control value of each of the arms and, a dead time generating circuit for extracting the optimized dead time corresponding to the drive control value from the correlation map. The time taken until the other of the semiconductor elements is turned on after one thereof has received a command to turn off the same is the optimized dead time extracted by the dead time generating circuit.

According to another aspect of the present invention, a semiconductor device includes arms provided with semiconductor elements, a dead time generating circuit for generating a dead time of each of the arms and applying an actual control value obtained by adding the dead time to an input to each of the arms, target control value applying means for applying a target control value to the dead time generating circuit as the input, initial control command value generating means for receiving an initial control command value corresponding to control to be conducted by each of the arms or generating the same, and target control value setting means for setting the target control value in such a manner as to be able to achieve the actual control value coincident with the initial control command value. The target control value is set by the target control value setting means.

Other and further objects, features and advantages of the invention will appear more fully from the following description.

DETAILED DESCRIPTION OF THE PREFERRED EMBODIMENTS

First Embodiment

Figure 1:
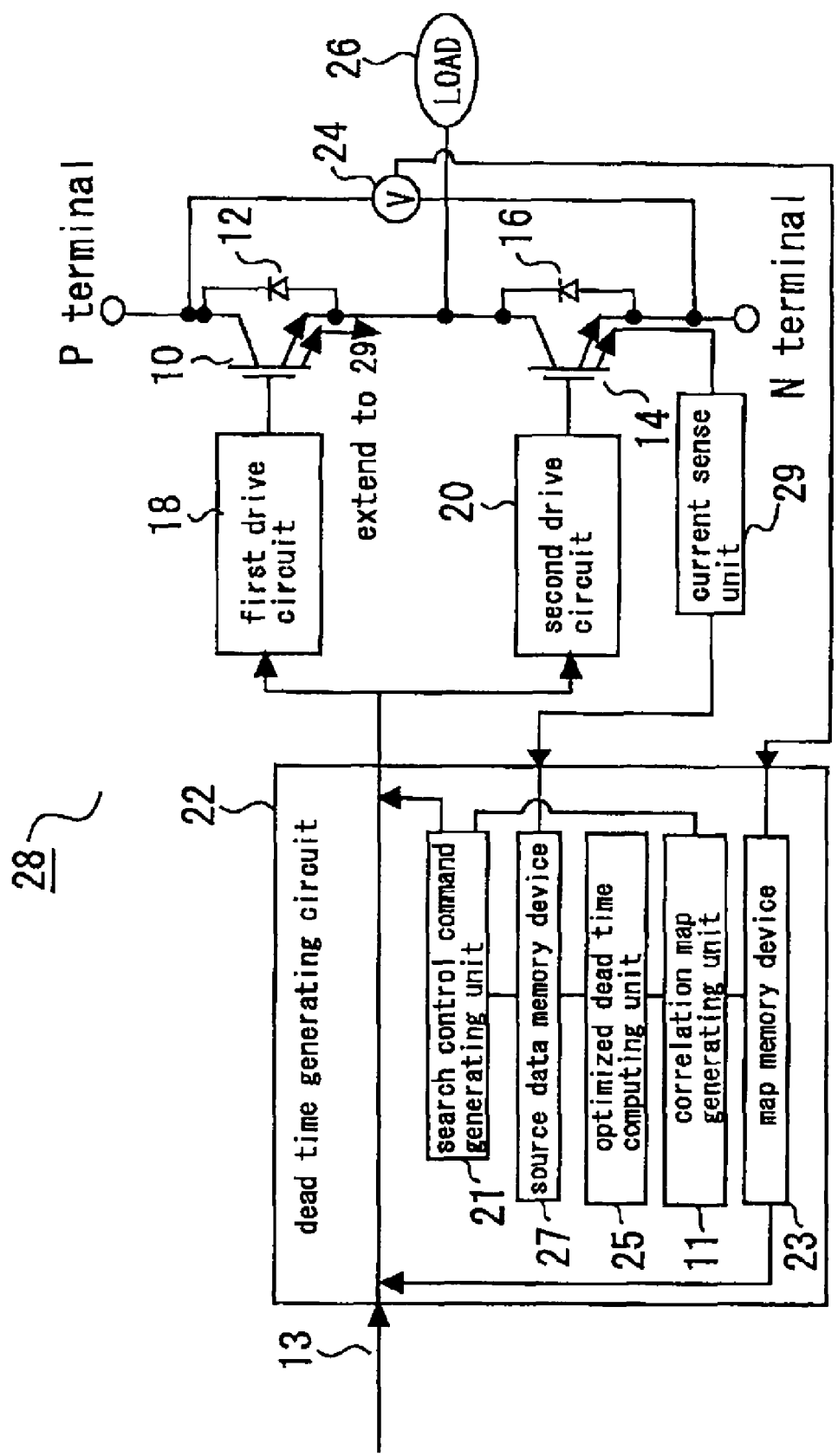
FIG. 1 is the semiconductor device according to the first embodiment.

The present invention relates to a semiconductor device capable of generating optimum dead time by simple processing. The semiconductor device according to the present embodiment has such a configuration as shown in FIG. 1. FIG. 1 will be explained subsequently. The semiconductor device 28 is equipped with a first semiconductor element 10 and a second semiconductor element 14. The first semiconductor element 10 and the second semiconductor element 14 form a half bridge circuit. The first semiconductor element 10 and the second semiconductor element 14 may be generically called arms subsequently.

The first semiconductor element 10 and the second semiconductor element 14 that constitute the arms correspond to power switching elements. As the power switching elements, may be mentioned, for example, IGBTs (Insulated Gate Bipolar Transistors) and power MOSFETs. A backflow diode 12 is connected in parallel to the first semiconductor element 10. A backflow diode 16 is connected in parallel to the second semiconductor element 14. Wirings connected to a load 26 are provided between the first semiconductor element 10 and the second semiconductor element 14. Thus, the semiconductor device 28 is provided with the arms that constitute semiconductor switches.

Further, a first drive circuit 18 is connected to the first semiconductor element 10. The first drive circuit 18 is a circuit for driving the gate of the first semiconductor element 10 and controls on/off of the first semiconductor element 10. On the other hand, a second drive circuit 20 is connected to the second semiconductor element 14. The second drive circuit 20 is a circuit for driving the gate of the second semiconductor element 14 and controls on/off of the second semiconductor element 14.

Further, the semiconductor device 28 according to the present embodiment includes a dead time generating circuit 22. The dead time generating circuit 22 is a circuit that generates dead time set to each of the arms employed in the present embodiment. The dead time generating circuit 22 is connected to the first drive circuit 18 and the second drive circuit 20. Here, the dead time indicates the time taken from transmission of a command to turn off one of the semiconductor elements constituting the arms to transmission of a command to turn on the other semiconductor element after the former transmission. That is, the dead time indicates the time provided to avoid the two semiconductor elements constituting the arms from being brought to an on state simultaneously. In other words, the dead time corresponds to the time provided to suppress short-circuits in the arms and indicates the time taken to compensate for turning on of the other semiconductor element after one of the semiconductor elements has actually been turned off. The dead time generating circuit 22 of the present embodiment generates dead time using a map storage or memory device 23 provided in the dead time generating circuit 22. The dead time generating circuit 22 receives a control signal or command 13 transmitted from outside the semiconductor device 28 according to the present embodiment. Here, the control command 13 is a command related to the duties of the first semiconductor element 10 and the second semiconductor element 14 and includes a command about switching. The semiconductor device 28 is required to perform control that has complied with the control command 13 identically.

The map memory device 23 provided in the dead time generating circuit 22 will be explained subsequently. In the present embodiment, a correlation map to be described later is stored in the map memory device 23. The correlation map is a map that has defined the relationship between control values of the arms and optimized dead time corresponding to dead time optimized with respect to the control values. It is thus possible to grasp how the dead time may be set to a given control value if the correlation map is referred to. In the present embodiment, the correlation map should be set every arm. Thus, the correlation map is defined by pre-measuring the characteristics of the semiconductor elements that constitute the arms.

Figure 2:
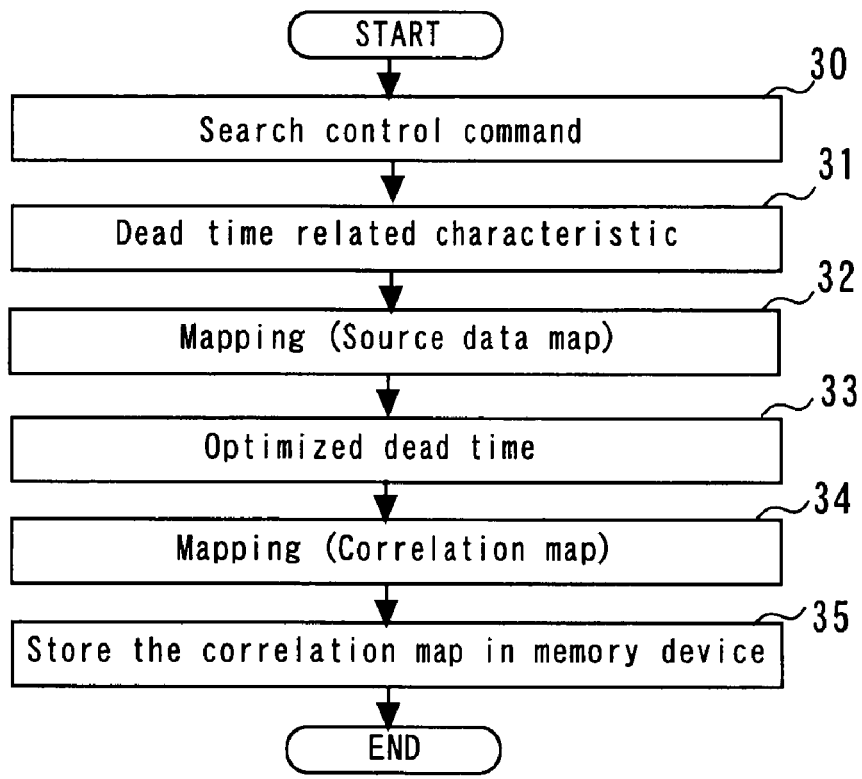
FIG. 2 is a flowchart for describing a procedure for creating the correlation map.

FIG. 2 is a flowchart for describing a procedure for creating the correlation map referred to above. The correlation map creating procedure will be explained subsequently in accordance with the flowchart shown in FIG. 2. In order to create the correlation map, a control command called search control command is first transmitted to each of the arms (Step 30). The search control command is transmitted from a search control command generating unit 21 to each arm. The search control command is a command for setting the control value of each arm to a predetermined value. Such a search control command is set in plural form with respect to a predetermined range of control values. The search control command employed in the present embodiment is a command for controlling a PN terminal-to-terminal voltage corresponding to a voltage applied between a P terminal and an N terminal shown in FIG. 1.

When the search control command is transmitted, a dead time related characteristic corresponding to a characteristic related to an off operation of each arm controlled by the search control command is measured (Step 31). The dead time related characteristic is of a characteristic that determines the dead time. In the present embodiment, the dead time related characteristic indicates a delay time corresponding to the time taken until each of the arms is actually turned off after it has received a command to turn off the same. A current sense unit 29 performs measurement of the delay time corresponding to the dead time related characteristic and transmission thereof to the dead time generating circuit 22. The current sense unit 29 can measure the delay time by measuring the current of each arm. The current sense unit 29 is connected to the dead time generating circuit 22. The delay time computed by the current sense unit 29 is transmitted to the dead time generating circuit 22.

Figure 4:
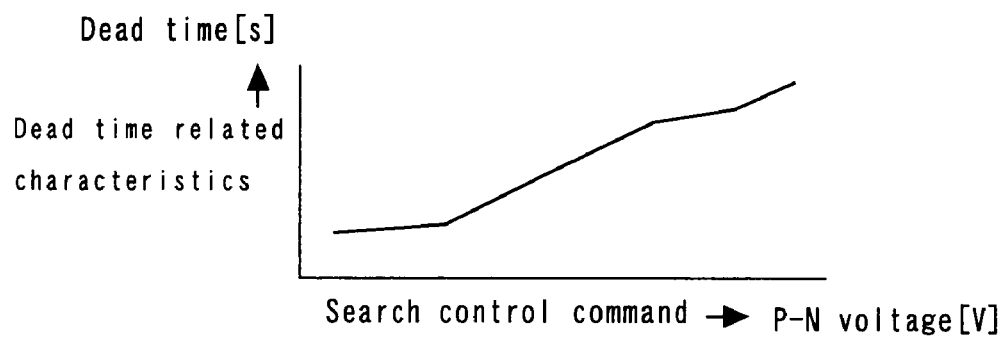
FIG. 4 is a graph indicating the correlation between the search control command and the dead time related characteristics.

Next, the procedure proceeds to a process indicated at Step 32. At Step 32, a map indicative of the relationship between the search control command and the dead time related characteristics is created. Such a map as shown in FIG. 4 is created at Step 32 of the present embodiment. This is of a graph indicating the correlation between the search control command and the dead time related characteristics and is referred to as source data map. In the present embodiment, the source data map is a graph indicative of the correlation between the PN terminal-to-terminal voltage and the delay time. The source data map is stored in a source data memory device 27 provided in the dead time generating circuit 22.

When the process at Step 32 is terminated, the procedure proceeds to a process at Step 33. At Step 33, the optimized dead time is established or fixed up with respect to each search control command from the source data map. The optimized dead time is generated by an optimized dead time computing unit 25. Here, the optimized dead time indicates a time interval long to the extent that no arm short-circuit is caused and dead time short to the extent that control stability is not impaired, both of which are taken in consideration of the dead time related characteristics referred to above. This meaning will be described later. The optimized dead time is determined every search control command value.

Next, the procedure proceeds to a process at Step 34. At Step 34, a correlation map obtained by mapping the correlation between each search control command referred to above and the optimized dead time is generated. The generation of the correlation map is conducted by a correlation map generating unit 11 provided in the dead time generating circuit 22.

The generated correlation map is stored in the map memory device 23 provided in the dead time generating circuit 22 (Step 35). The correlation map is stored in the map memory device 23 and associates the values of the search control commands, i.e., the control values of the arms and the optimized dead time with one another. Thus, if only the control value of each arm (PN terminal-to-terminal voltage in the present embodiment) can be grasped, then the corresponding optimized dead time can be read simply by referring to the correlation map.

Incidentally, the semiconductor device 28 according to the present embodiment shown in FIG. 1 has such a configuration that the control signal 13 is inputted to the dead time generating circuit 22 to start its control.

Figure 3:
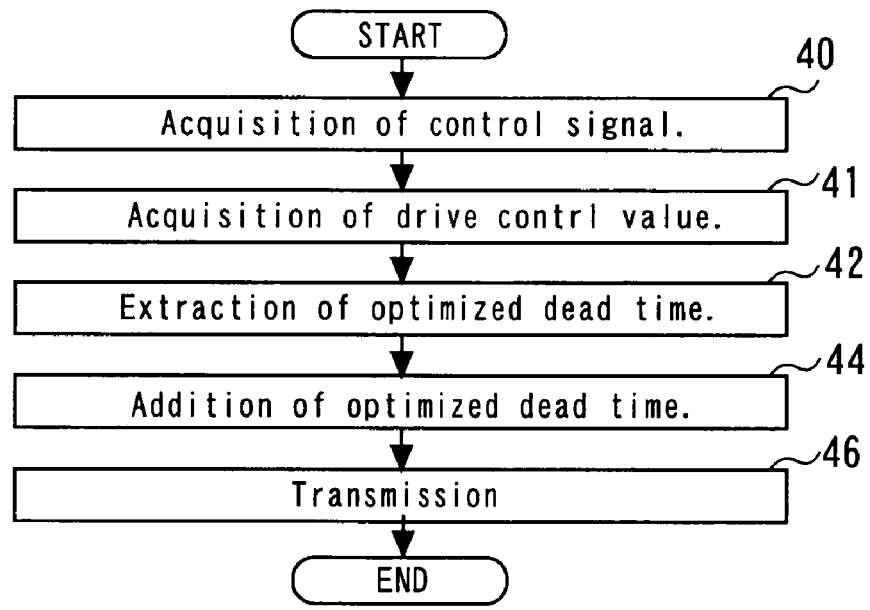
FIG. 3 is a flowchart for describing operation of the semiconductor device provided with the map memory device in which the correlation map described in FIG. 2 has been stored.

FIG. 3 is a flowchart for describing operation of the semiconductor device 28 provided with the map memory device 23 in which the correlation map described in FIG. 2 has been stored. This will be explained below along FIG. 3. The dead time generating circuit 22 first obtains a control signal 13 from outside the semiconductor device 28 (Step 40). The control signal 13 is of a signal related to the duties and switching to be achieved by the arms.

Next, the control signal 13 is transmitted to the first drive circuit 18 and the second drive circuit 20, where the first semiconductor element 10 and the second semiconductor element 16 are controlled by the control signal 13. When the arms are being controlled by the control signal 13 in this way, the dead time generating circuit 22 obtains a drive control value. The drive control value indicates a control value of each arm. In the present embodiment, the drive control value means a voltage between the PN terminals of the arms. The drive control value is acquired by allowing a voltage sensor 24 to measure the PN terminal-to-terminal voltage (Step 41). The drive control value obtained in this way is sent to the dead time generating circuit 22 by communication or wiring. When the dead time generating circuit 22 receives the drive control value therein, it refers to the correlation map of the map memory device 23. The dead time generating circuit 22 searches and extracts the optimized dead time corresponding to the drive control value (Step 42).

Next, the dead time generating circuit 22 adds the optimized dead time to the control signal 13 to perform switching added with the optimized dead time extracted at Step 42 (Step 44). Thus, control to which the optimized dead time has been applied as the dead time at the time that switching between the arms is conducted by the control signal 13, is performed (Step 46).

Figure 7:
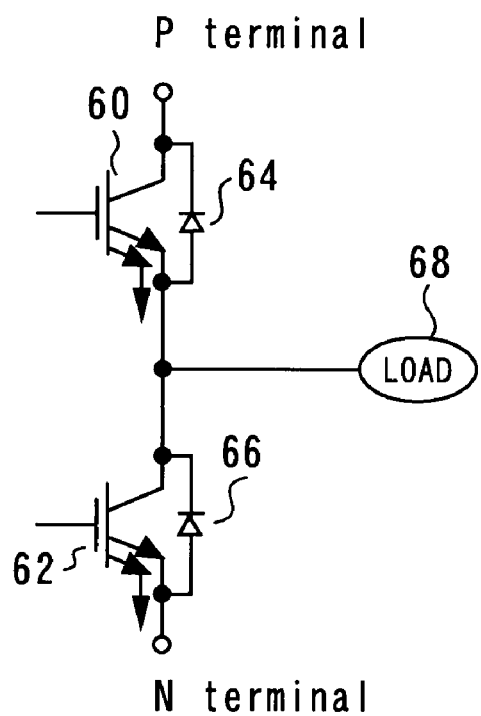
FIG. 7 shows the constitution of arms.
Figure 8:
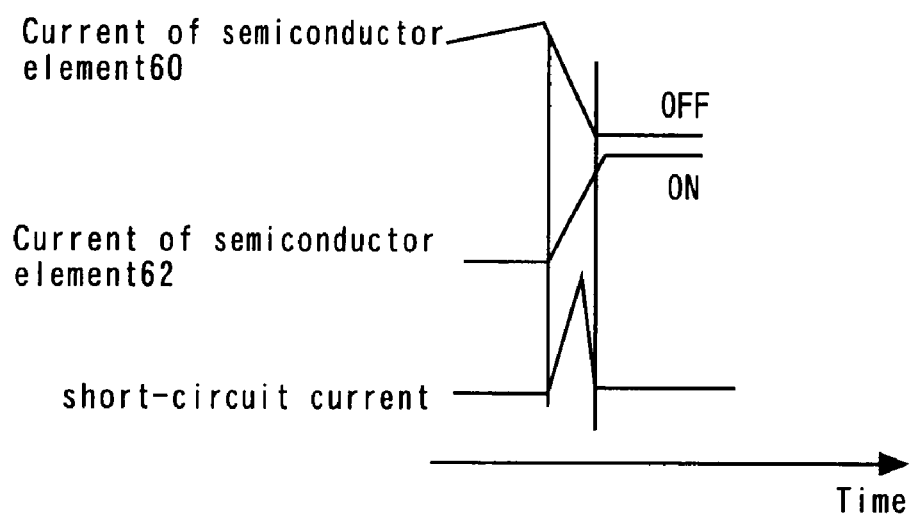
FIG. 8 indicates the current of the semiconductor element, the current of the semiconductor element, and the arm short-circuit current.

It is generally considered that when the other of a semiconductor element 60 and a semiconductor element 62 is turned on with timing provided to unhold one thereof off in a semiconductor device in which the semiconductor element 60 and the semiconductor element 62 are arranged vertically so as to constitute arms as shown in FIG. 7, a short-circuit current flows between the arms, so that degradation in the characteristics of the arms and the like occur. This is called arm short-circuit. When an off-command for the semiconductor element 60 and an on-command for the semiconductor element 62 are done with the same timing, for example, an on-off current of the semiconductor element 60 and an on current of the semiconductor element 62 cross over each other. This crossover might cause the arm short-circuit. This manner is shown in FIG. 8. A graph shown in FIG. 8 indicates the current of the semiconductor element 60, the current of the semiconductor element 62 and the arm short-circuit current as viewed from above. It is understood from this figure that when the on current of the semiconductor element 62 flows with the timing at which the on-off current of the semiconductor element 60 is a finite value, the short-circuit current occurs.

The arms are provided with dead time to prevent the arm short-circuit. Further, there is a need to reliably turn off one to be turned off, of the semiconductor elements during the dead time. It is thus general that the dead time is fixed by the maximum value of delay times at a plurality of semiconductor elements.

Figure 6:
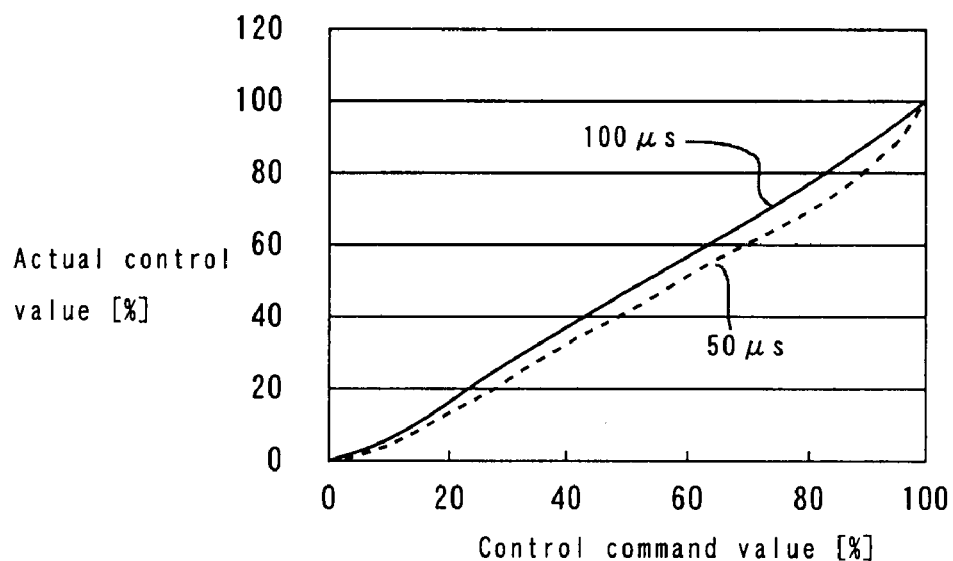
FIG. 6 shows the relationship between control command values and actual control values.

Incorporating the dead time defined in this way into its corresponding drive signal (control signal) of each semiconductor element makes it possible to correct the control signal and suppress the arm short-circuit. The effect of suppressing the arm short-circuit is enhanced by providing the dead time long. Due to the following reasons, however, it is preferable to set the dead time as small in value as possible. That is, due to the provision of the dead time, a deviation occurs between a duty control value (called duty control value taken assuming that no dead time is added, i.e., control command value in FIG. 6) to be achieved originally, and an actual duty control value (called actual control value in FIG. 6). This deviation will cause a voltage variation and distortion of a current waveform. Incidentally, FIG. 6 relates to duty control values at the time that they are adjusted in such a manner that ½ of dead time is subtracted from the on-time of an upper arm and the on-time of a lower arm respectively in a control system for controlling the ratio between the on-time and off-time of the upper arm. FIG. 6 has described the relationship between control command values and actual control values at the time that the dead time is set to 5 μs with respect to drive cycles 100 μs and 50 μs. When the drive cycle is 100 μs and the control command value is 50% here, the on-time of the lower arm results in 50−5/2=47.5 μs. Similarly, the on-time of the lower arm at the time that the drive cycle is 50 μs, results in 25−5/2=22.5 μs. It can be said from the above calculations that as the drive cycle becomes short, a relative influence exerted on the on-time of the dead time becomes large.

As is apparent from the descriptions made up to now, the deviation of the actual control value relative to the control command value increases as the dead time becomes longer. Such a control system causes problems in that when a drive frequency is switched, the timing provided to perform switching of the instructed drive frequency is shifted and the actual control value relative to the same control command value varies. The variation in the actual control value relative to the control command value depending upon the drive frequency is referred to as "non-linear problem". It is general that a controller that constructs a control system is designed on the assumption that a control command value and an actual control value have a constant relationship with each other, that is, they are linear. Thus, when the control system involving the "non-linear problem" is used, the control system is considered to become instable. Therefore, the dead time is preferably a small value.

It is thus required that the dead time to be set assumes "an interval long to the extent that the arm short-circuit can be suppressed and an interval short to the extent that control's stability is not impaired". The power conversion device disclosed in the patent document 1 furnishes an acceptable answer to this problem. The power conversion device disclosed in the patent document 1 transmits an output produced from each current transformer provided every arm to a circuit called dead time control circuit. The dead time control circuit performs switching to the suitable dead time, judging from the output. This switching is conducted in such a manner that the arm short-circuit can be suppressed while a high-frequency operation is being maintained satisfactory. Thus, according to the power conversion device described in the patent document 1, the dead time corresponding to "the interval long to the extent that the arm short-circuit can be suppressed and the interval short to the extent that the stability of control is not impaired" can be set.

In the power conversion device disclosed in the patent document 1, however, each time the command for driving each arm is outputted, the outputs produced from the current transformers provided every arm are transmitted to the dead time control circuit, where dead-time switching is done. More specifically, a problem arises in that since an arithmetic operation performed by a circuit called level discriminating circuit, an arithmetic operation performed by the dead time control circuit, and the like are required, the processing becomes complicated.

According to the constitution of the present embodiment, the above problem can be solved. That is, since the dead time generating circuit 22 has the correlation map in the present embodiment, the optimum dead time can be produced simply by measuring the voltage of each arm, corresponding to the drive control value and thereafter searching and extracting the optimized dead time corresponding to the arm's voltage. It is thus possible to decide the dead time promptly. Since the optimized dead time corresponds to "the interval long to the extent that the arm short-circuit can be suppressed and the interval short to the extent that the stability of control is not impaired", the arm short-circuit can be suppressed while the control's stability is being maintained.

Although the semiconductor device 28 according to the present embodiment is equipped with the source data memory device 27, correlation map generating unit 11, optimized dead time computing unit 25, search control command generating unit 21, and current sense unit 29 corresponding to means for generating the correlation map, the present invention is not limited to it. That is, even though an external device taken instead of the means for generating the correlation map performs its generation and the generated correlation map is stored in the map memory device 23, the effects of the present invention are obtained. According to such a construction, the semiconductor device 28 can be simplified in configuration since it needs not to have the means for generating the correlation map.

Although the delay time is used as the dead time related characteristic in the present embodiment, the present invention is not limited to it. That is, even though the dead time related characteristic is of other characteristic in so far as the optimized dead time can be determined from the dead time related characteristic, the effects of the present invention are obtained. Described specifically, the dead time related characteristic may be a characteristic related to an off characteristic of a semiconductor element.

Although such a configuration that the dead time generating circuit 22 is equipped with the map memory device 23 is taken in the present embodiment, the present invention is not limited to it. That is, since the utilization of the correlation map is enabled in so far as the dead time generating circuit 22 is capable of referring to the map memory device 23, the effects of the present invention are not lost. Thus, the map memory device 23 may be disposed outside the dead time generating circuit 22.

Although the correlation map should be set every arm in the present embodiment, the present invention is not limited to it. If, for example, variations in arm characteristic fall within a predetermined allowable range, then the optimized dead time may not be determined every arm. Alternatively, if the correlation map can be produced with desired accuracy at a product development stage, then the optimized dead time may not be determined every arm. Since the correlation map can be shared between the respective arms in these cases, it is not necessary to provide the configuration (means) required to generate the correlation map. Even though the correlation map shared between the arms is provided, the effects of the present invention are not lost.

Figure 5:
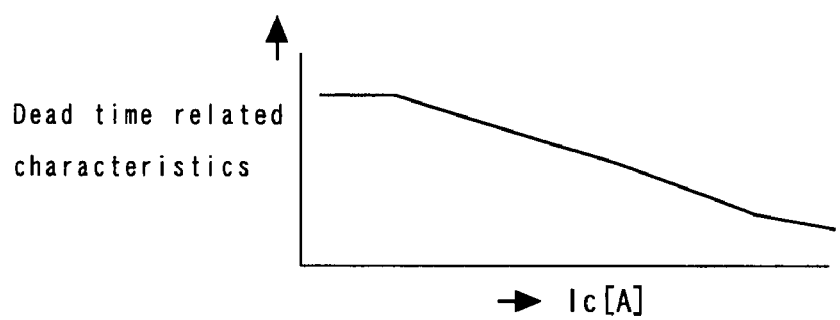
FIG. 5 shows source data map.

Although the PN terminal-to-terminal voltage is applied as the search control command and the dead time related characteristic corresponding to the PN terminal-to-terminal voltage is acquired in the present embodiment, the present invention is not limited to it. That is, such a configuration that the current is caused to flow through each arm may be taken as the search control command. In this case, means for acquiring a drive control value is a current sensor capable of measuring the current of each arm. Such one as shown in FIG. 5 is generated as a source data map. Since the optimized dead time can be generated by acquiring each drive control value and referring to the correlation map, the effects of the present invention are obtained even though such a configuration is taken.

Although, in the present embodiment, the PN terminal-to-terminal voltage is applied as the search control command and the dead time related characteristic corresponding to the PN terminal-to-terminal voltage is acquired, the present invention is not limited to it. That is, such a configuration as to allow each arm to vary the temperature may be taken as the search control command. In this case, means for acquiring each drive control value is of a temperature sensor capable of measuring the temperature of each arm. Since the optimized dead time can be generated by acquiring each drive control value and referring to the correlation map, the effects of the present invention are obtained even though such a configuration is taken.

Although the source data memory device 27 is used in the present embodiment, the present invention is not limited to it. That is, upon generating a correlation map, optimized dead time is computed from a dead time related characteristic corresponding to one search control command, and this routine may be repeated a predetermined number of times. Thus, even though the optimized dead time is computed sequentially, the effects of the present invention are not lost. Further, the source data memory device 27 becomes unnecessary.

Second Embodiment

Figure 9:
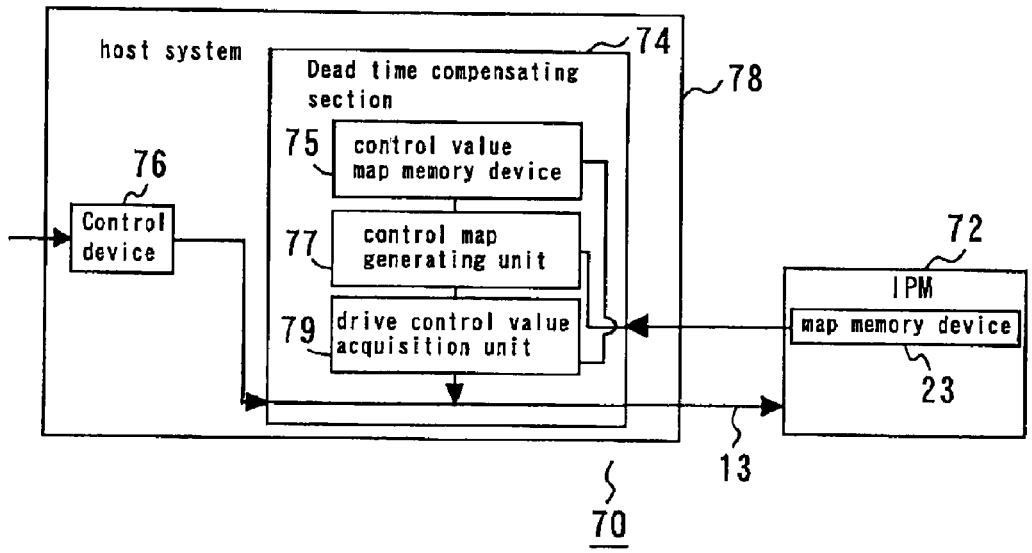
FIG. 9 is the semiconductor control system according to the second embodiment.

The present embodiment relates to a semiconductor device capable of attaining a desired actual control value in the semiconductor device to which the dead time is set. A semiconductor control system according to the present embodiment is provided with such a configuration as shown in FIG. 9. The semiconductor control system 70 according to the present embodiment can be divided broadly into a semiconductor device 72 and a host system 78. Here, the semiconductor device 72 will be regarded as identical to the semiconductor device 28 shown in FIG. 1, which has been described in the first embodiment.

On the other hand, the host system 78 is of a control value transmitting circuit which sends a control value to be realized by the semiconductor device 72. The host system 78 includes a control device 76 and a dead time compensating section 74. The control device 76 is a device which transmits a signal for controlling the semiconductor device 72 to the dead time compensating section 74 on the assumption that a command value for control and an actual control value are linear. The signal related to the control, which is transmitted by the control device 76, is referred to as initial control command.

The dead time compensating section 74 is a section which changes the value of the initial control command, coupled with the fact that the dead time is set by the semiconductor device 72. This change is conducted by referring to a control value map memory device 75 provided in the dead time compensating section 74. That is, the dead time compensating section 74 changes the initial control command value to a control command value to be described later, which is called target control command value. The semiconductor device 72 performs control in accordance with the target control command value transmitted from the dead time compensating section 74.

Figure 10:
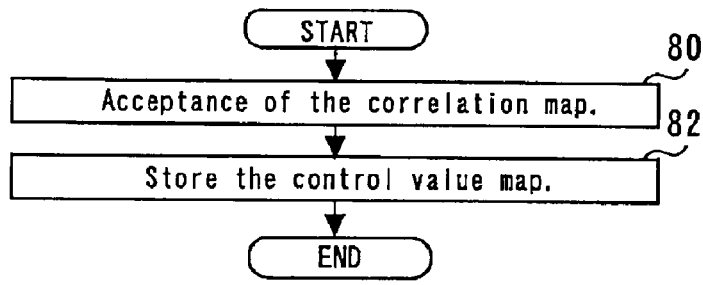
FIG. 10 is a diagram for describing a method for generating the control value map.

FIG. 10 is a diagram for describing a method for generating the control value map referred to above. The dead time compensating section 74 first receives information on dead time related to a drive control value (Step 80). In the present embodiment, the acceptance of the correlation map provided in the semiconductor device 72 is conducted at Step 80. Thus, in the present embodiment, the control value map and the correlation map coincide with each other. Step 80 is executed by a control map generating unit 77. Next, the control value map is stored in the control value map memory device 75 (Step 82). The control value map is generated as described above. Incidentally, the dead time compensating section 74 is equipped with a drive control value acquisition unit 79 for obtaining a drive control value to operate the control value map of the present embodiment upon actual control to be described later.

Figure 11:
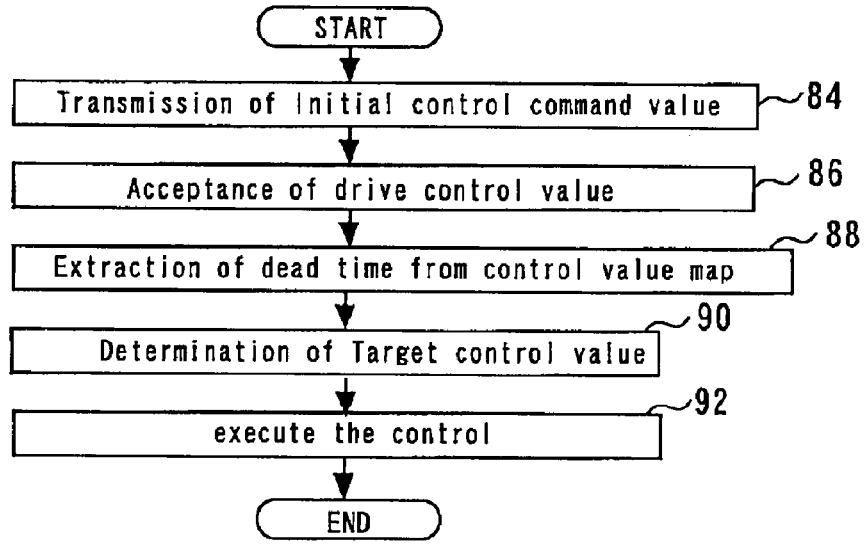
FIG. 11 is a diagram for describing operation of the semiconductor control system according to the second embodiment.

FIG. 11 is a diagram for describing operation of the semiconductor control system 70 according to the present embodiment. The operation thereof will be explained subsequently along FIG. 11. The control device 76 first generates an initial control command value corresponding to control to be executed at each arm of the semiconductor device 72. The initial control command value is transmitted to the dead time compensating section 74 (Step 84). Next, the dead time compensating section 74 having received the initial control command value therein accepts the drive control value of the semiconductor device 72 through the drive control value acquisition unit 79 (Step 86). The reception of the drive control value may be acquired by communication. Alternatively, each wiring may be disposed to obtain its reception.

Subsequently, dead time (optimized dead time) corresponding to the acquired drive control value is extracted by referring to the control value map stored in the control value map memory device 75 (Step 88). The dead time (optimized dead time) extracted here is used in the dead time generating circuit of the semiconductor device 72. Thus, the dead time compensating section 74 corrects the initial control command value to compensate for a reduction in the duty of the initial control command value due to the influence of the dead time. That is, the dead time compensating section 74 corrects the initial control command value to a target control value added with control duty by the dead time referred to above (Step 90). The target control value is transmitted from the dead time compensating section 74 to the dead time generating circuit of the semiconductor device 72 (Step 92), where control based on the target control value is conducted.

The target control value results in one obtained by reducing the control duty by the dead time at the dead time generating circuit of the semiconductor device 72. This decrease is equivalent to an increase in the control duty added to the initial control command value at the dead time compensating section 74. It is therefore possible to cause the actual control value applied from the dead time generating circuit to its corresponding drive circuit to coincide with the initial control command value.

Figure 12:
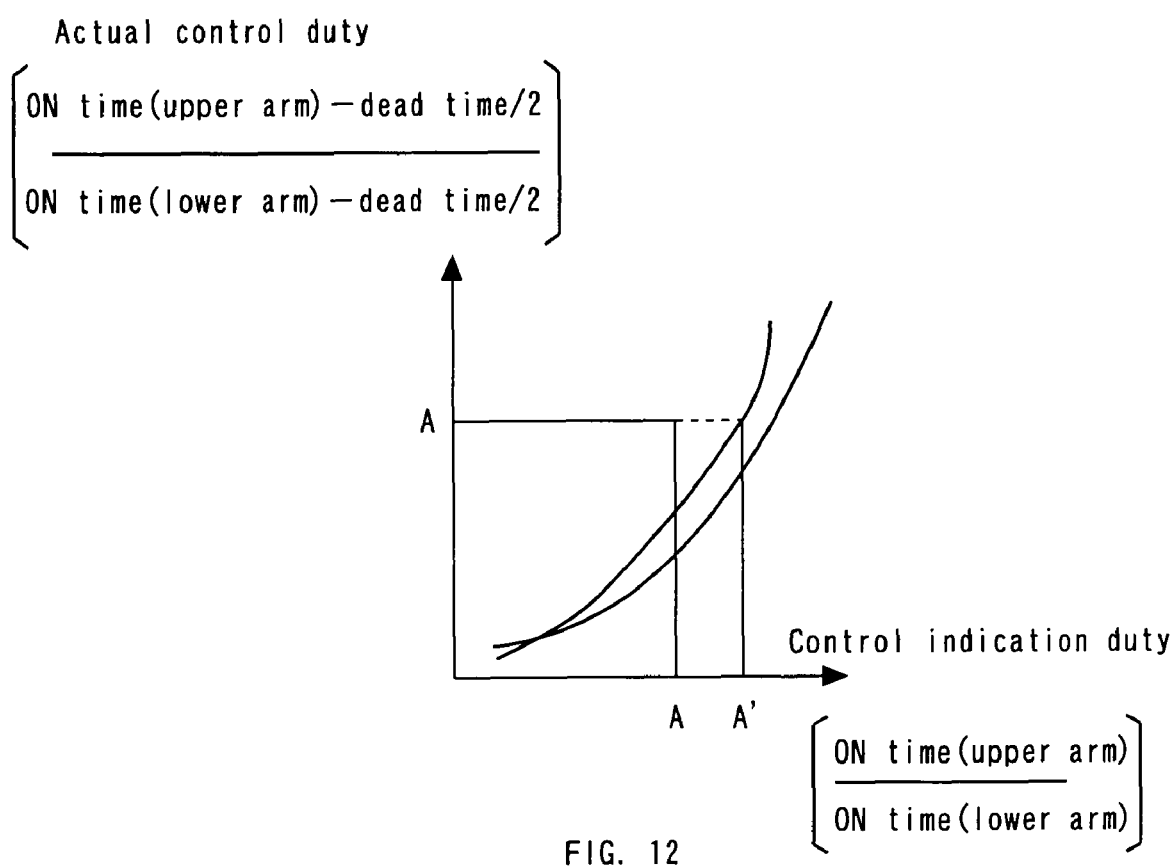
FIG. 12 is a diagram for showing the effects of the second embodiment graphically.

FIG. 12 is a diagram for showing the effects of the present embodiment graphically. A horizontal axis of a graph shown in FIG. 12 indicates control indication duty. The control indication duty is a command transmitted from the host system 78 to the semiconductor device 72. On the other hand, a vertical axis thereof indicates actual control duty. The actual control duty means control actually performed on each arm by the semiconductor device 72 having received the control indication duty therein. Now consider where, for example, A is transmitted to the semiconductor device 72 as the control indication duty. In this case, the control indication duty is A whereas the actual control duty is less than A. The actual control duty coincident with the control indication duty cannot be achieved in this way. This is because the dead time is set at the semiconductor device. Thus, in the present embodiment, A' (target control value) obtained by adding control duty reduced by the dead time to the initial command value A in advance is generated by the host system 78 to bring A (initial control command value) to the actual control duty. When the target command value A' is transmitted to the semiconductor device 72, the control duty is reduced by the dead time, whereby actual control coincident with A is eventually performed.

The dead time indicates an interval which should be provided for the arm short-circuit and does not reach zero. Accordingly, an unavoidable problem was to cause a deviation between the initial control value and the actual control value and thereby degrade the stability of control.

According to the configuration of the present embodiment, the above-described problem can be solved. In the present embodiment, the dead time compensating section 74 corrects the initial control command value in such a manner that the initial control command value and the actual control value coincide with each other, and transmits the same to the semiconductor device. Thus, since the initial control command value and the actual control value coincide with each other, the control's stability can be maintained satisfactory while the arm short-circuit is being suppressed by provision of the dead time.

Although the present embodiment takes such a configuration that the control value map is provided, the present invention is not limited to it. That is, the dead time compensating section may receive a dead time control value (information on dead time) in real time upon an actual operation of the semiconductor control system. Even though the initial control command value is corrected to its corresponding target control value, based on the dead time accepted in real time, it is possible to ensure the control's stability corresponding to the effects of the present invention. In this case, there is no need to prepare the control value map.

Although the semiconductor control system is divided into the semiconductor device and the host system in the present embodiment, the present invention is not limited to it. That is, even though the dead time compensating section is disposed on the semiconductor device side, the effects of the present invention are not lost. Even though the dead time generating circuit is disposed in the host system, the effects of the present invention are not lost. Thus, the classification of the semiconductor control system into the semiconductor device and the host system is done for convenience of explanation. Hence, its classification is not an indispensable condition.

Although the semiconductor device according to the present embodiment is configured in a manner similar to the first embodiment, the present invention is not limited to it. That is, any one may be used as the semiconductor device if there are provided ones each of which sets the dead time to control each arm.

Although the control value map memory device is disposed in the dead time compensating section in the present embodiment, the effects of the present invention are obtained even if the dead time compensating section is disposed in any place in so far as reference can be made to the dead time compensating section.

Although the control value map employed in the present embodiment is of the map indicative of the relationship between the dead time and the drive control value, the present invention is not limited to it. In the case of a semiconductor device in which the dead time is a fixed value, for example, the effects of the present invention are obtained even in the case of a map indicative of the relationship between an initial control command value and a target control value.

According to the present invention, the optimum dead time can be generated by simple processing while the stability of control of a semiconductor device is being maintained.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2007-267089, filed on Oct. 12, 2007 including specification, claims, drawings and summary, on which the Convention priority of the present application is based, are incorporated herein by reference in its entirety.

What is claimed is:

1. A semiconductor device comprising:
   arms formed by two semiconductor elements;
   a map memory device to store therein a correlation map between a control value for each of the arms and an optimized dead time to be set for the control value;
   drive control value acquiring means for acquiring a drive control value of each of the arms; and
   a dead time generating circuit to extract the optimized dead time corresponding to the drive control value from the correlation map,
   wherein the time taken until the other of the semiconductor elements is turned on after one thereof has received a command to turn off the same is the optimized dead time extracted by the dead time generating circuit.

2. The semiconductor device according to claim 1, further including:
   search control command transmitting means for transmitting a plurality of search control commands to the arms;
   data measuring means for measuring a dead time related characteristic corresponding to a characteristic for determining a dead time with respect to each of the search control commands;
   optimized dead time generating means for computing an optimized dead time corresponding to a dead time for compensating for arm short-circuit suppression from the dead time related characteristic for each said search control command; and
   means for creating a correlation map between the optimized dead time and each of the control values.

3. The semiconductor device according to claim 1, wherein the correlation map is stored in the map memory device.

4. The semiconductor device according to claim 1, wherein the drive control value is a current that flows through each of the arms, and
   wherein the drive control value acquiring means is a current sensor provided for the arms.

5. The semiconductor device according to claim 1, wherein the drive control value is a voltage applied to each of the arms, and
   wherein the drive control value acquiring means is a voltage sensor provided for the arms.

6. The semiconductor device according to claim 1, wherein the drive control value is a temperature of the arm held in position, and
   wherein the drive control value acquiring means is a temperature sensor provided for the arms.

7. The semiconductor device according to claim 1, further including:
   a control value transmitting circuit to apply a target control value of each of the arms to the dead time generating circuit;
   a control value map memory device to store therein a control value map indicative of a relationship between the target control value and an actual control value added with the optimized dead time; and
   target value extracting means for extracting the target control value for achieving a desired said actual control value, based on the control value map,
   wherein the target control value applied to the dead time generating circuit is of the target control value extracted by the target value extracting means.

8. A semiconductor device comprising:
   arms provided with semiconductor elements;
   a dead time generating circuit to generate a dead time of each of the arms and to apply an actual control value obtained by adding the dead time to an input to each of the arms;
   target control value applying means for applying a target control value to the dead time generating circuit as the input;
   initial control command value generating means for receiving, or generating, an initial control command value corresponding to control to be conducted by each of the arms; and
   target control value setting means for setting the target control value in such a manner as to be able to achieve the actual control value coincident with the initial control command value.

9. The semiconductor device according to claim 8, further including:
   dead time extracting means for extracting information on the dead time from the dead time generating circuit; and
   control value map creating means for creating a map for performing conversion from the initial control command value to the target control value, based on the dead time,
   wherein the target control value setting means sets the target control value using the control value map.

10. A semiconductor device comprising:
    arms formed by two semiconductor elements;
    a map memory device to store therein a correlation map between a control value for each of the arms and an optimized dead time to be set for the control value;
    a drive control value acquiring unit to acquire a drive control value of each of the arms; and
    a dead time generating circuit to extract the optimized dead time corresponding to the drive control value from the correlation map,
    wherein the time taken until the other of the semiconductor elements is turned on after one thereof has received a command to turn off the same is the optimized dead time extracted by the dead time generating circuit.

11. The semiconductor device according to claim 10, further including:
- a search control command transmitting unit to transmit a plurality of search control commands to the arms;
- a data measuring unit to measure a dead time related characteristic corresponding to a characteristic for determining a dead time with respect to each of the search control commands;
- an optimized dead time generating unit to compute an optimized dead time corresponding to a dead time for compensating for arm short-circuit suppression from the dead time related characteristic for each said search control command; and
- a correlation map generating unit to create a correlation map between the optimized dead time and each of the control values.

12. The semiconductor device according to claim 10, wherein the correlation map is stored in the map memory device.

13. The semiconductor device according to claim 10, wherein the drive control value is a current that flows through each of the arms, and
- wherein the drive control value acquiring unit is a current sensor provided for the arms.

14. The semiconductor device according to claim 10, wherein the drive control value is a voltage applied to each of the arms, and
- wherein the drive control value acquiring unit is a voltage sensor provided for the arms.

15. The semiconductor device according to claim 10, wherein the drive control value is a temperature of the arm held in position, and
- wherein the drive control value acquiring unit is a temperature sensor provided for the arms.

16. The semiconductor device according to claim 10, further including:
- a control value transmitting circuit to apply a target control value of each of the arms to the dead time generating circuit;
- a control value map memory device to store therein a control value map indicative of a relationship between the target control value and an actual control value added with the optimized dead time; and
- a target value extracting unit to extract the target control value for achieving a desired said actual control value, based on the control value map,
- wherein the target control value applied to the dead time generating circuit is of the target control value extracted by the target value extracting unit.

17. A semiconductor device comprising:
arms provided with semiconductor elements;
- a dead time generating circuit to generate a dead time of each of the arms and to apply an actual control value obtained by adding the dead time to an input to each of the arms;
- a target control value applying unit to apply a target control value to the dead time generating circuit as the input;
- an initial control command value generating unit to receive, or generate, an initial control command value corresponding to control to be conducted by each of the arms; and
- a target control value setting unit to set the target control value in such a manner as to be able to achieve the actual control value coincident with the initial control command value.

18. The semiconductor device according to claim 17, further including:
- a dead time extracting unit to extract information on the dead time from the dead time generating circuit; and
- a control value map generating unit to create a map for performing conversion from the initial control command value to the target control value, based on the dead time,
- wherein the target control value setting unit sets the target control value using the control value map.

* * * * *